(12) United States Patent
Volpato et al.

(10) Patent No.: US 11,243,013 B2
(45) Date of Patent: Feb. 8, 2022

(54) SOLAR CONCENTRATOR HAVING A CONTINUOUS PARABOLIC REFLECTIVE SURFACE

(71) Applicant: ENI S.P.A., Rome (IT)

(72) Inventors: Claudio Boris Volpato, Novara (IT); Lino Carnelli, Novara (IT); Giulio Lanza, Turin (IT); Marco Morone, Nichelino (IT); Stefano Re Fiorentin, Turin (IT)

(73) Assignee: ENI S.P.A., Rome (IT)

( * ) Notice: Subject to any disclaimer, the term of this patent is extended or adjusted under 35 U.S.C. 154(b) by 0 days.

(21) Appl. No.: 17/048,166

(22) PCT Filed: Apr. 12, 2019

(86) PCT No.: PCT/IB2019/053030
§ 371 (c)(1),
(2) Date: Oct. 16, 2020

(87) PCT Pub. No.: WO2019/202449
PCT Pub. Date: Oct. 24, 2019

(65) Prior Publication Data
US 2021/0102731 A1    Apr. 8, 2021

(30) Foreign Application Priority Data
Apr. 17, 2018   (IT) .................. 102018000004615

(51) Int. Cl.
*F24S 23/70*   (2018.01)
*F24S 30/425*  (2018.01)
*F24S 23/74*   (2018.01)

(52) U.S. Cl.
CPC ............. *F24S 23/82* (2018.05); *F24S 23/74* (2018.05); *F24S 30/425* (2018.05)

(58) Field of Classification Search
CPC .......... F24S 21/82; F24S 23/74; F24S 30/425; F24S 2030/18; Y02E 10/52; H01L 31/0547
See application file for complete search history.

(56) References Cited

U.S. PATENT DOCUMENTS 4,135,493 A    1/1979  Kennedy
4,422,614 A *  12/1983 Santos ................. F24S 30/425
                                              248/475.1

(Continued)

FOREIGN PATENT DOCUMENTS

DE         19801078 A1    7/1999
DE      202010001474 U1    6/2010

OTHER PUBLICATIONS

International Search Report dated Jun. 26, 2019 for PCT application No. PCT/IB2019/053030.

(Continued)

*Primary Examiner* — David J Laux
*Assistant Examiner* — Nikhil P Mashruwala
(74) *Attorney, Agent, or Firm* — Ohlandt, Greeley, Ruggiero and Perle, LLP

(57) ABSTRACT

The present invention relates to a system for a parabolic solar concentrator (SCA) having a substantially continuous reflective surface aiming to maximize the efficiency of the parabolic solar concentrator and of its fabrication method. The system of the present invention allows the fabrication of a low cost parabolic solar concentrator, based on a torsion bar, ribs and a plurality of reflective pieces of sheet metal preferably covered with a reflective film. The parabolic solar concentrator according to a preferred embodiment allows the reduction of surfaces shading the reflective surface. Another advantage is the lack of presence of supporting or movement elements protruding in the concave side of the (Continued)

parabola, not including receiver tube components and supports, thereby increasing the reflection efficiency and solar collection.

12 Claims, 6 Drawing Sheets

(56) References Cited

U.S. PATENT DOCUMENTS

| | | | | |
|---|---|---|---|---|
| 4,520,794 A * | 6/1985 | Stark | ............ | F24S 30/425 |
| | | | | 126/684 |
| 5,964,216 A * | 10/1999 | Hoffschmidt | ........ | F24S 23/74 |
| | | | | 126/696 |
| 6,668,820 B2 * | 12/2003 | Cohen | ............ | F24S 23/79 |
| | | | | 126/685 |
| 8,256,413 B2 | 9/2012 | Koetter et al. | | |
| 8,443,795 B2 * | 5/2013 | Kimura | ............ | F24S 23/745 |
| | | | | 126/696 |
| 2010/0252030 A1 | 10/2010 | Marcotte et al. | | |
| 2011/0108090 A1 | 5/2011 | Lance et al. | | |
| 2013/0298897 A1 * | 11/2013 | Kawane | ............ | G02B 7/183 |
| | | | | 126/600 |
| 2014/0182578 A1 * | 7/2014 | Fortin | ............ | F24S 10/45 |
| | | | | 126/600 |
| 2018/0023845 A1 * | 1/2018 | Eickhoff | ............ | F24S 25/10 |
| | | | | 126/600 |

OTHER PUBLICATIONS

Written Opinion dated Jun. 26, 2019 for PCT application No. PCT/IB2019/053030.

* cited by examiner

SOLAR CONCENTRATOR HAVING A CONTINUOUS PARABOLIC REFLECTIVE SURFACE

CROSS REFERENCE TO RELATED APPLICATIONS

This application claims the benefit under 35 U.S.C. § 119(a) of Italian Application No. 102018000004615 filed on Apr. 17, 2018, and is a national stage application under 35 U.S.C. § 371, of PCT/IB2019/053030 filed on Apr. 12, 2019, the contents of both are incorporated by reference herein in their entirety.

BACKGROUND OF THE DISCLOSURE

1. Field of the Disclosure

The object of the present invention is a parabolic solar concentrator assembly (SCA) wherein the reflective surface is substantially continuous over an entire SCA (Solar Collector Assembly) for the purpose of maximising the efficiency thereof and the process for constructing said SCA.

2. Description of the Related Art

The use of linear parabolic solar concentrators to generate electrical energy or steam, which concentrators are based on concentrated solar thermal power (CSP) technology, using linear parabolic reflectors, underwent a huge increase in the mid 70s (following the oil crisis of 1973).

Many different embodiments have been developed and design engineers have focused their attention mainly on improving the efficiency of the systems while simplifying their construction.

The solutions generally used for producing parabolic reflectors for linear solar concentrators involve costs that are still high, yet the costs/benefit ratio of this technology is still superior to that of conventional thermoelectric technologies and even of some renewable sources (e.g. wind energy). Solutions currently on the market which relate to the production of the parabolic reflective surface can be grouped into two categories. The first category comprises those solutions that make use of suitably shaped glass mirrors, the second comprises those based on metal sheets covered with reflective films.

Although the solution providing for the use of metal sheets covered with reflective film involves lower costs for the reflector, it requires a generally more complex support structure because it must ensure that the metal sheets retain the correct parabolic shape even with wind stresses. The structure that is most effective in respect of both rigidity and cost is the one with a torsion bar and ribs as is described, for example, in patent U.S. Pat. No. 4,135,493. However, this solution provides fixing only at the ends, which fixing, by exerting a force system, constrains the metal sheets to adhere to the parabolic surface of the ribs. The solution, which dates from 1977, provided for the use of a single reflective sheet by virtue of the still moderate dimensions of the parabolic solar collectors of that time. Recent systems, on the other hand, provide for much larger dimensions and make it necessary to juxtapose a plurality of reflective sheets, which have to be interlinked and made to rotate integrally by means of a support structure when the aim is to produce a sun-tracking collector, that is, one that is set to change its orientation based on the diurnal movement of the sun.

One of the problems posed by systems of the available prior art is that of the correct and advantageous positioning of the supports, the systems that produce movement, and the respective supports with respect to the reflective surface, which can cause a hindrance and considerable shading. This positioning determines the impossibility of achieving the substantially continuous reflective surface for an entire SCA (solar collector assembly). This is also impossible on account of interference between the reflective surface and the support pillars of the dish when it has to assume the resting position in case of high wind or when out of service. A substantially continuous reflective surface would be a considerable advantage that would allow limitation of the optical losses linked to the distance normally existing between the various collectors, achieving an increase in overall optical efficiency. For the purposes of the present invention, "substantially continuous reflective surface" is intended to mean a surface that is continuous, with the exception of the slots normally provided to compensate for the thermal expansion due to solar irradiation and those provided to support the receiver tube. According to the current state of the art, no solutions are available for sheet-metal SCA systems that are supported by a structure with torsion bar or with a rear reticular structure that have a substantially continuous surface. One known state-of-the-art solution is described in document U.S. Pat. No. 8,256,413B2 which uses counterweights to optimize the positioning of the centre of mass. However, this solution involves a complexity of construction for the adoption of mirrors as a reflective surface and, providing the axis of rotation as coincident with the torsion bar, does not allow recovery of the collectors into a position +/−120° (optimal position for protection of the receiver tubes) in that the torsion bar is too close to the reflective surface and therefore interferes with the support pillars, preventing these inclinations from being reached. Furthermore, a space of approximately 1 metre is necessary between the reflective units at the point where the actuating members are positioned.

Another problem of SCA systems of the available prior art is due to the fixing of various pieces of sheet metal covered with reflective film on the bearing structure. Such fixing normally occurs via insertion of the pieces of sheet metal into guides appropriately pre-arranged on the structure itself. The operation of inserting the pieces of sheet metal into the guides is extremely laborious and can easily cause damage to the reflective film on account of scraping within the guides, compromising in this way the uniformity of the reflective surface.

The solution that is the object of the present invention aims to lessen, at least partially, the disadvantages of the prior art.

SUMMARY OF INVENTION

According to a first aspect of the present invention, a system is produced for a parabolic solar concentrator (SCA) having a substantially continuous reflective surface, the system comprising a mobile part which comprises: a parabolic support structure with a plurality of ribs, each having a substantially parabola shape and apt to support and fitted with retention means for holding in position a plurality of reflective pieces of sheet metal, preferably substantially rectangular in shape, apt to reflect and concentrate the solar radiation towards the focus of the dish; a plurality of mounts to keep the support structure raised from the ground and to orientate it around an axis of rotation, the axis of rotation being positioned to the rear of the dish with respect to its convex side; a receiver tube held by a plurality of supports substantially within the focus of the dish to intercept the solar radiation reflected by the plurality of pieces of reflective sheet metal; a torsion bar connected to the support structure and positioned externally to the dish on the convex side having the function of guaranteeing the solidity of the support structure and of permitting rotation of the support structure relative to the axis of rotation; characterized in that said torsion bar is positioned in such a way that the centre of gravity of the mobile part of the parabolic solar concentrator falls within a distance within the range 0 to 0.5 metres from the axis of rotation.

For the purposes of the present description and of the claims that follow, the definitions of the numerical intervals always comprise the extremes.

Yet more preferably, said torsion bar is positioned in such a way that the centre of gravity of the system falls exactly on the axis of rotation.

In the aforementioned system fora parabolic solar concentrator, said receiver tube may be an individual member, or comprise a plurality of members joined one to the other in series at the ends along a common longitudinal axis. The length of each receiver tube member preferably corresponds to the distance between two adjacent supports of the receiver tube.

Said receiver tube members are preferably of a length equal one to the other. Each rib preferably comprises two arms, each with the shape substantially of a semi-parabola, that are joined together at the level of the vertex of the dish by means of support plates, and is connected to the other ribs at the ends distant from said support plates, by means of two C-shaped beams. Moreover, the support plates also join the ribs to the torsion bar, one per rib. The term length of the rib is intended to refer to the sum of the length of the two semi-parabola arms of the rib itself.

The ribs are preferably fixed to the torsion bar by means of a plurality of support plates and are rendered integral one with the other by means of two beams placed at the two ends of the ribs themselves.

In a preferred embodiment, the plurality of pieces of sheet metal are covered with a reflective film. Furthermore, for ease of construction, the plurality of pieces of sheet metal are laid out on the support structure and fixed thereto by means of retention means.

Ideally, the retention means comprise appropriately shaped removable brackets. The object of the present invention is furthermore a process for constructing a system as described above, comprising the steps of: arranging a support structure comprising a plurality of ribs, each having a substantially parabola shape apt to support and fitted with retention means for holding in position a plurality of reflective pieces of sheet metal that are apt to reflect and concentrate the solar radiation towards the focus of the dish, the plurality of ribs being fixed to the torsion bar by means of a plurality of support plates, the ribs being rendered integral one with the other by means of two C-shaped beams placed at the free ends of the ribs; laying through gravity a plurality of pieces of reflective sheet metal, each having one of the two dimensions substantially equal to the length of the ribs in such a way that the sides of the pieces of reflective sheet metal, the dimension of which is substantially equal to the length of the ribs, are arranged orthogonally with respect to the axis of rotation of the parabolic solar concentrator; fixing the ends of the pieces of reflective sheet metal to the beams by means of strips; fixing the pieces of sheet metal to the ribs by means of appropriately shaped removable brackets.

Preferably, when the receiver tube comprises a plurality of members, said pieces of reflective sheet metal have one of the two dimensions substantially equal to the length of the receiver tube member. In another preferred configuration, said pieces of reflective sheet metal have one of the two dimensions substantially equal to the sum of the lengths of two or more receiver tube members.

In accordance with another preferred configuration, said pieces of reflective sheet metal have one of the two dimensions substantially equal to a submultiple of the length of a receiver tube member, so that a whole number greater than 1 of pieces of reflective sheet metal can correspond to each receiver tube member.

The system that is the object of the present invention enables a linear solar concentrator to be made low cost, based on a torsion-bar structure with ribs and a reflector consisting of metal sheets, preferably covered with reflective film. The concentrator according to a preferred embodiment of the present invention enables the projecting surfaces on the reflective dish to be minimized; this entails the advantage that the solar collector has no support member or movement member (not considering the supports of the receiver tube or of the receiver tube members) that protrudes into the concave portion of the dish, increasing the efficiency thereof in respect of reflection and solar collection.

To obtain this result, the axis of rotation of the solar concentrator according to the present invention is positioned to the rear of the reflective dish (i.e. on the convex side), with an arrangement of the mobile masses (reflective surfaces+support structure of the mobile portion) that allows the centre of gravity of the mobile portion of the parabolic solar concentrator to be brought as close as possible to the axis of rotation. In a preferred configuration, the centre of gravity of the mobile portion of the parabolic solar concentrator falls substantially on the axis of rotation. The rear support structure of the mobile portion of the parabolic solar concentrator is advantageously obtained through the setback of the torsion bar with a torsion bar+frames structure, which has advantages of simplicity of construction, assembly and transportation. Convergence of the centre of gravity with the axis of rotation, arranged at the rear, furthermore allows minimization of the number and of the dimensions of the actuators assigned to movement of the collector. This allows these actuators to be installed in a setback position completely behind the reflective surface, freeing the latter from structural interruptions functional to the installation of conventional means of movement.

In a preferred embodiment of the present invention, the torsion bar is composed of a hollow cylinder and is of such dimensions as to have a torsional rigidity sufficient to allow connection of a plurality of concentrators in series, governed by a single actuation system (e.g. 8 concentrators per actuator).

According to a preferred embodiment of the present invention, the metal sheets making up the reflective surface are rendered integral with the parabolic support structure by means of clamps fixed following arrangement of the pieces of sheet metal on the parabolic ribs. This solution allows a greater rigidity to be obtained, and better manoeuvrability of the resulting structure with respect to the prior art. Furthermore, the advantage is obtained of preserving the reflective surface from possible damage during the assembly phase which, according to the systems of the prior art, occurred by insertion of the pieces of sheet metal into suitable guides, with the risk of scraping of the reflective surface against the guides.

BRIEF DESCRIPTION OF THE DRAWINGS

Reference will now be made to a series of drawings to facilitate the description of a number of preferred embodiments of the present invention.

DETAILED DESCRIPTION

Figure 1:
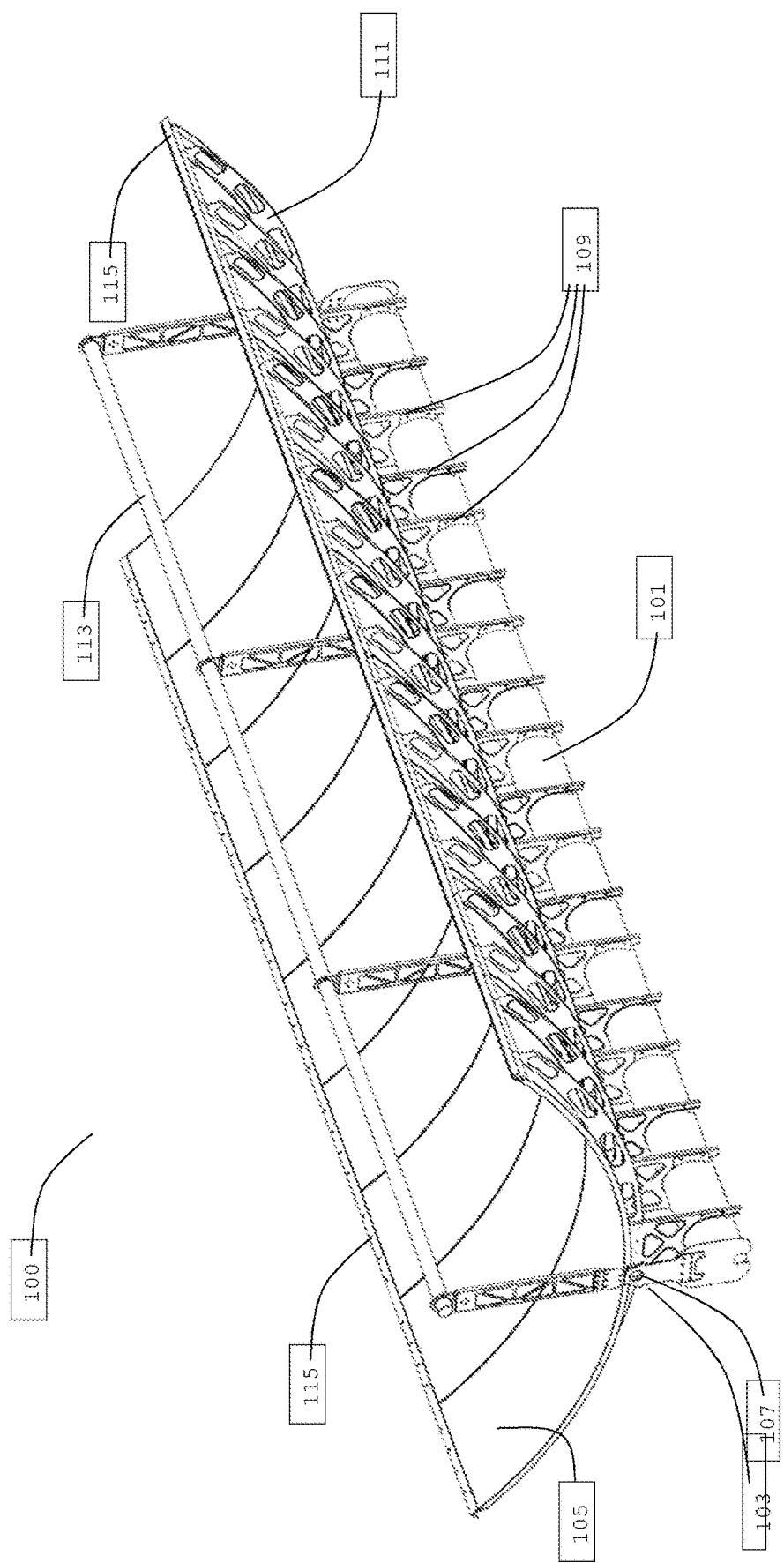
FIG. 1 shows a parabolic solar concentrator system according to a preferred embodiment of the present invention.

FIG. 1 shows an SCA system 100 according to a preferred embodiment of the present invention. A torsion bar (or tube) 101 is positioned at a distance from the vertex 103 of the reflective dish 105 such as to ensure that the centre of gravity of the mobile structure falls substantially at the axis of rotation 107 of the reflective dish 105. The axis of rotation is positioned externally to the dish, on the convex side (therefore outside the dish). Such an arrangement allows all the movement instruments and associated supports to be positioned outside the dish itself, in such a way as not to obscure the reflective surface. A maximum margin of 0.5 metre distance between the centre of gravity and the axis of rotation is admissible without altering the functions of the system according to the present invention: positioning the centre of gravity on the axis of rotation of the parabolic structure constitutes the ideal solution for achieving the greater advantages of manoeuvrability and of efficiency provided by the system according to the present invention, however a centre of gravity that is slightly shifted according to the tolerances indicated above allows these advantages to be achieved at least in part. In this way, the torsion bar 101 functions also as a counterweight, overcoming in this way the problems of complexity and costs of production and of the heavy weight associated with the solutions of the prior art (e.g. of the system described in document U.S. Pat. No. 8,256,413). A receiver tube 113, located substantially within the focus of the dish, collects the solar radiation, reflected by the reflective dish 105. Said receiver tube may comprise a plurality of receiver tube members joined together in series at the ends along a common longitudinal axis.

This allows a reflective surface to be produced that is substantially continuous, even at the various support points (pillars) of an entire SCA.

Figure 2:
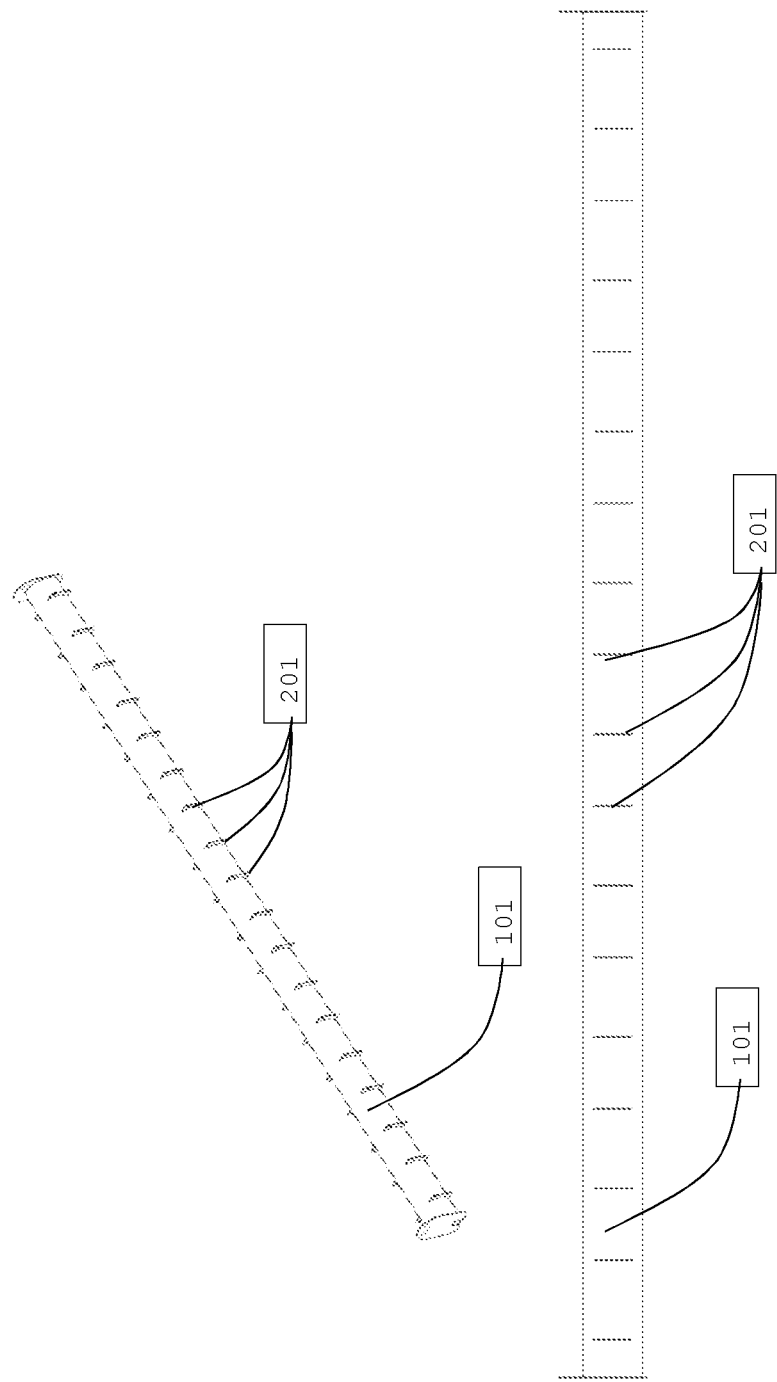
FIG. 2 shows a detail of the torsion bar with the pairs of brackets.

In a preferred embodiment of the present invention, at the torsion bar are fixed (e.g. by means of welding) pairs of brackets 201 on opposite sides, at suitable distances along the axis of the bar, as shown in FIG. 2. These brackets have slotted holes ideal for subsequent fixing of the members for connection to the ribs (connection plates 109 shown in FIG. 1).

Figure 3:
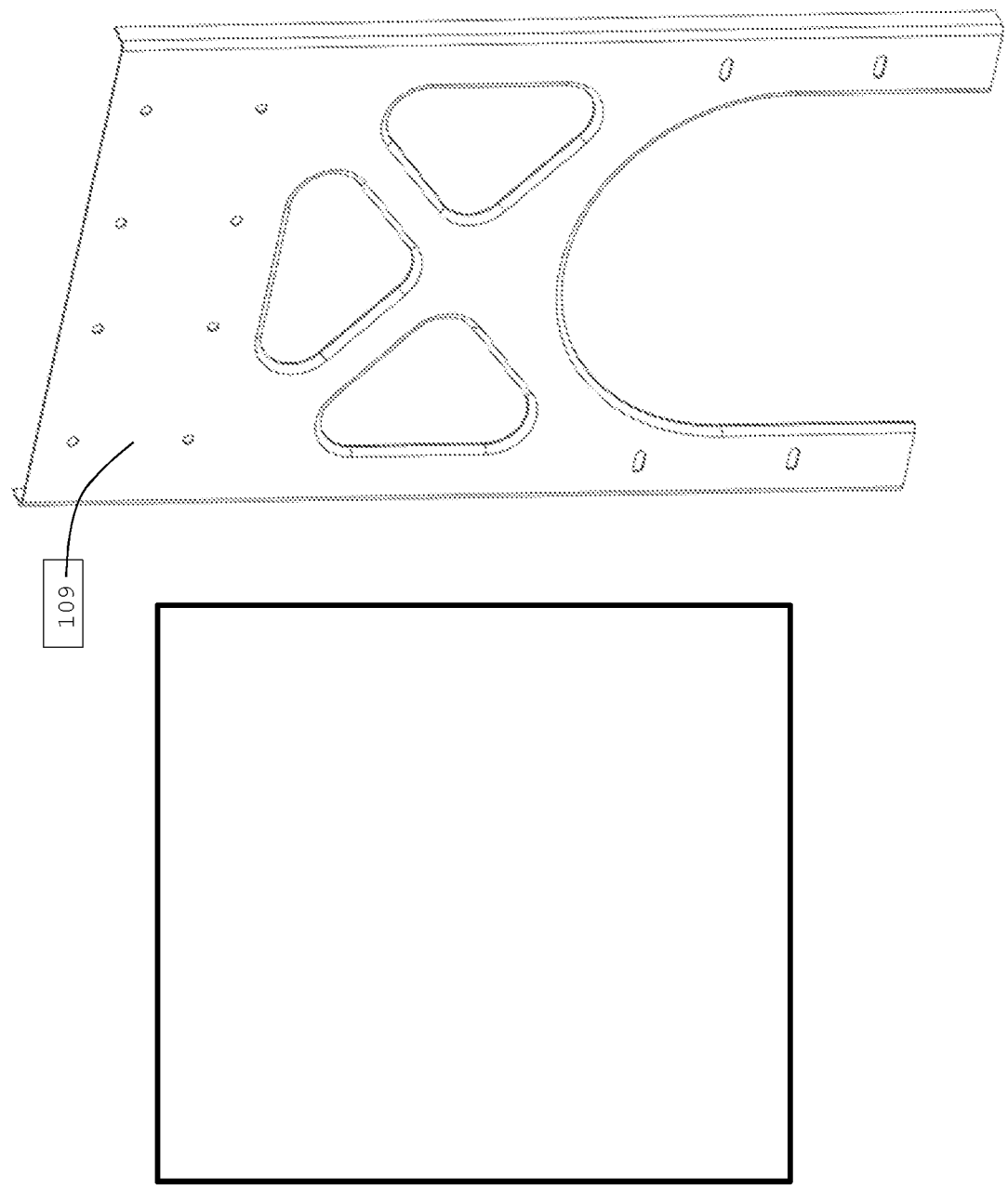
FIG. 3 shows the detail of a connecting plate.

The connection plates 109, shown more clearly in FIG. 3, are preferably produced by sheet metal pressing and have two extensions that function as supports to the side of the torsion bar, which extensions allow alignment of said connection plates on an abutment plane in order to guarantee their precise angular positioning prior to connection to the brackets of the torsion bar 101.

To the connection plates 109 are fixed the ribs 111 which, according to a preferred embodiment of the present invention, are made in two pieces of pressed sheet metal. Fixing of the two half-ribs is ensured by a certain number of threaded connections. For the purpose of guaranteeing the correct angular positioning of the two half-ribs, the latter are held in the correct position by tools which restrain them at the ends.

Pairs of ribs are connected by brackets apt to guarantee the correct geometry of the connection plates and to function as support for the supports of the receiver tube or receiver tube members joined one to the other in series at the ends along the same longitudinal axis. Furthermore, the ribs at the external ends are all connected one to the other by means of a C-shaped beam 115 which ensures that they are maintained in parallel and functions as a base for subsequent fixing of the metal sheets.

The SCA system according to a preferred embodiment of the present invention provides for positioning of the reflective metal sheets in the correct parabolic geometry in a first step by gravity and in a second step by pressure, on the plate already partially shaped by gravity, of a soft pad (air cushion or sponge matting) which causes said metal sheets to adhere to the ribs. Once positioned correctly, the reflective metal sheets are simply pinched at the ends by strips with screws, without the need to fold or puncture the sheets themselves. For the purpose of avoiding phenomena of detachment of the metal sheets from the ribs or buckling phenomena, the parabolic edges of each sheet are restrained unilaterally by a pressed sheet metal profile in the form of a brace. In another implementation, the disadvantage of possible detachments of the metal sheets is overcome with the use of glue between metal sheets and parabolic profile, with bi-adhesive elements (tape or some other) or in combination one with the other.

In an embodiment of the present invention, the metal sheets are positioned on the ribs, transporting them suspended by the ends. Due to gravity they assume a shape already close to the parabolic shape of the ribs. A pressure member of a soft material (air or sponge cushion) ensures the perfect contact of the metal sheets with the ribs along the whole of their extent. Their fixing is ensured by end plates covered with a Teflon film, which engage in the beams mentioned above and pinch the sheets.

The parabolic sides of the metal sheets may be restrained with respect to deformations that tend to detach the metal sheets from the ribs, by braces produced using parabolic profiles of pressed and galvanized sheet metal. In another possible implementation, for example, the disadvantage of possible detachments of the metal sheets is overcome with the use of glue between metal sheets and parabolic profile, with bi-adhesive elements (tape or some other) or in combination one with the other.

At the ends of the torsion bar end plates may be welded, to which are connected the supports that engage in the bushings of the support pillars.

Figure 4:
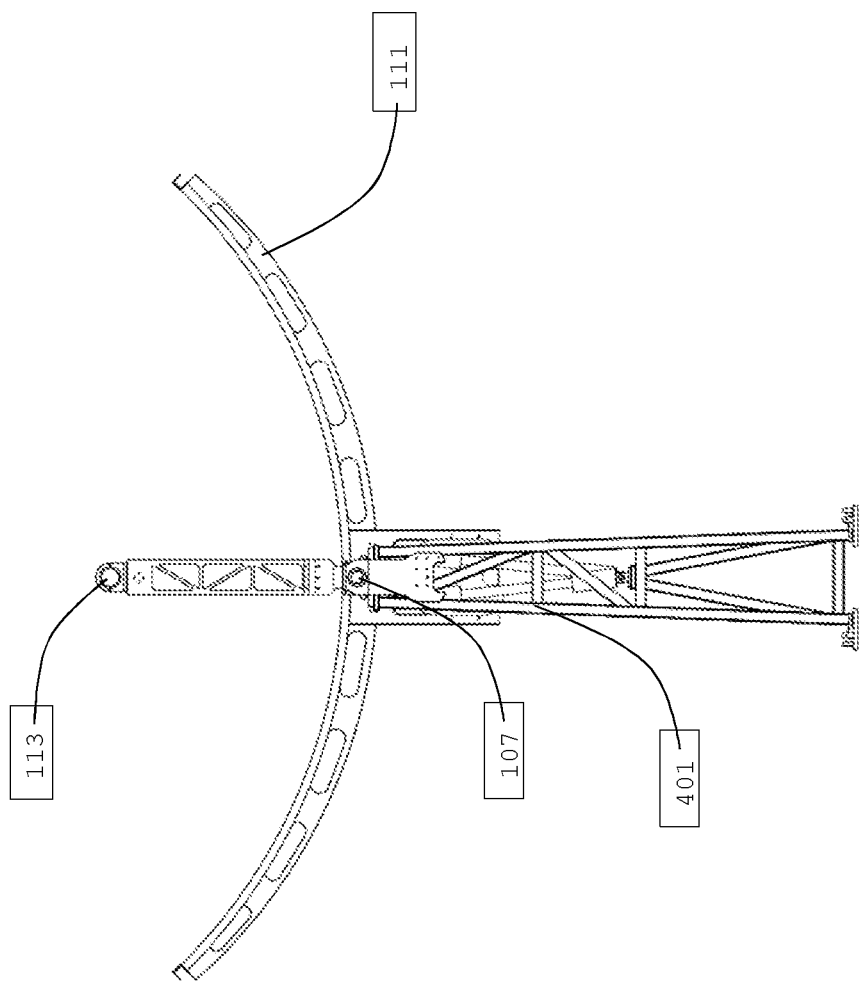
FIG. 4 is a cross-sectional side view of the parabolic solar concentrator system with a support pillar and the axis of rotation.
Figure 5:
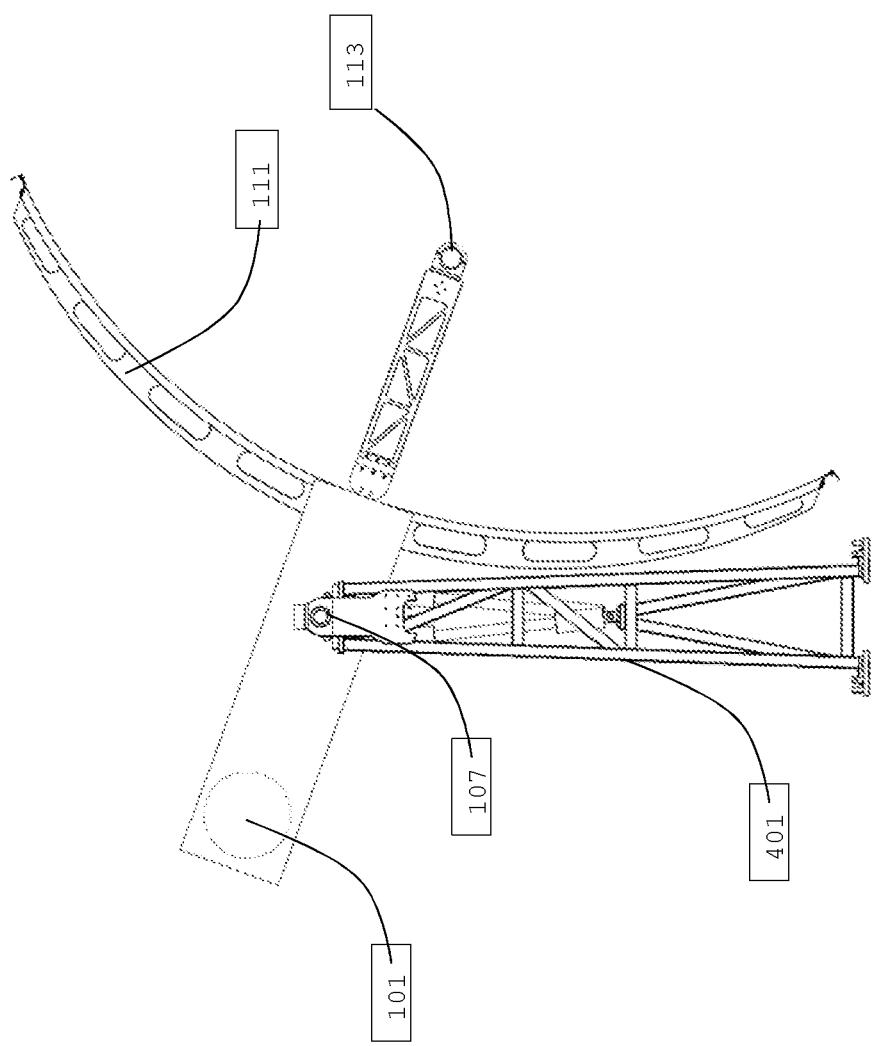
FIG. 5 shows a detailed view of the support structure.

FIG. 4 shows a section of the support structure characterized by the setback of the torsion tube. FIG. 5 shows a preferred embodiment of the present invention. The torsion bar 101 is positioned at a distance from the dish such that the position of the centre of rotation (which must be very close to the centre of gravity) allows the positions of recovery (+and −110°) without interference between the support pillars 401 and the reflective surface of the dishes which is to be continuous for a whole SCA. The drawing shows a view of the support structure in which the variation is exaggerated for a better understanding of the concept.

In a preferred embodiment of the present invention, the length of the torsion bar 101 is smaller than that of the reflective surface of the dish and terminates at the level of the connection with the last rib. This is to allow easier rotation of the dish at the level of the support pillar, above all for the pillar in which the actuation system is located.

In one embodiment of the present invention, on the "caps" of the torsion bar (that is, the end plates that close said torsion bar) the connections are formed for the semi-shafts for the rotation and support of the dish.

The receiver tube supports are preferably structurally similar one to the other for the whole length of the SCA.

Between the terminal and contiguous panels of the dishes it is possible to insert the seal section provided as for all the other panels. This section can be connected to the beams on the edges of the two dishes.

Figure 6:
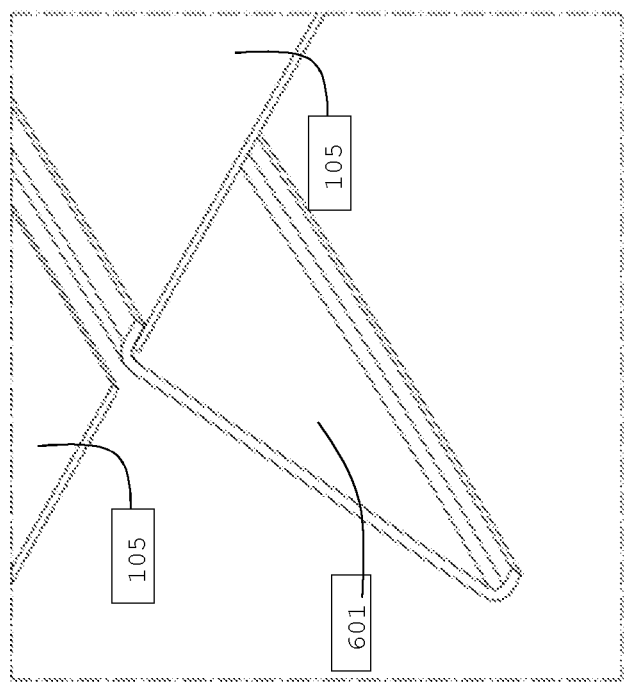
FIG. 6 is a diagrammatic view of the detail of a fixing clamp.

FIG. 6 shows one of the fixing clamps 601 used to block the pieces of sheet metal to the support structure. According to a preferred embodiment of the present invention, the metal sheets that make up the reflective surface are rendered integral with the support structure by means of clamps 601 fixed following arrangement of the pieces of sheet metal on the parabolic structure. As already described above, this solution enables a greater rigidity and an improved manoeuvrability of the resulting structure to be obtained with respect to the prior art. Furthermore, the advantage is obtained of preserving the reflective film from possible damage during assembly, which according to the systems of the prior art occurred via insertion of pieces of sheet metal into appropriate guides, with the risk of scraping of the film against the guides.

What is claimed is:

1. A system for a parabolic solar concentrator (SCA) having a substantially continuous reflective surface, the system comprising a mobile portion that comprises:
   a parabolic support structure with a plurality of ribs each having a substantially parabolic shape to support and configured to retain and hold in position a plurality of reflective pieces of sheet metal to reflect and concentrate solar radiation towards a focus of a dish;
   a plurality of supports to keep the support structure raised from a ground level and to orientate it around an axis of rotation, the axis of rotation being positioned to a rear of the dish with respect to a convex side of the dish;
   a receiver tube held substantially within the focus of the dish to intercept the solar radiation reflected by the plurality of reflective pieces of sheet metal;
   a torsion bar connected to the support structure and positioned externally to the dish on the convex side thereby guaranteeing the solidity of the support structure and permitting rotation of the support structure relative to the axis of rotation;
   wherein the torsion bar is positioned so that a center of gravity of the mobile portion of the parabolic solar concentrator falls within a distance within a range of 0 to 0.5 meters from the axis of rotation.

2. The system according to claim 1, wherein the torsion bar is positioned so that the center of gravity of the mobile portion of the parabolic solar concentrator falls substantially on the axis of rotation.

3. The system according to claim 1, wherein each of the plurality of ribs is composed of two arms, each in the form of a semi-parabola, that are joined together at a level of a vertex of the dish.

4. The system according to claim 1, wherein each of the plurality of the ribs comprise two arms, each in the form of a semi-parabola, that are joined together at a level of a vertex of the dish by a plurality of support plates, and are connected to each other at ends distant from the support plates, by two C-shaped beams.

5. The system according to claim 1, wherein the torsion bar is connected to the plurality of ribs by a plurality of connection plates, one per each rib.

6. The system according to claim 1, wherein the plurality of reflective pieces of sheet metal are covered with a reflective film.

7. The system according to claim 1, wherein the plurality of reflective pieces of sheet metal are laid out on the support structure and fixed and retained thereto.

8. The system according to claim 1, wherein the plurality of reflective pieces of sheet metal are retained by removable brackets.

9. The system according to claim 1, wherein the plurality of reflective pieces of sheet metal are rendered integral with the support structure by clamps fixed following arrangement of the plurality of reflective pieces of sheet metal on the parabolic structure.

10. A process for constructing the system according to claim 1, comprising the steps of:
    arranging the support structure comprising the plurality of ribs, each having a substantially parabolic shape to support and retain and hold in position the plurality of reflective pieces of sheet metal to reflect and concentrate the solar radiation towards the focus of the dish, the plurality of ribs being fixed to the torsion bar by a plurality of support plates, the ribs being rendered integral to each other by two C-shaped beams placed at free ends of the plurality of ribs;
    a laying by gravity the plurality of reflective pieces of sheet metal each having one of two dimensions substantially equal to a length of the ribs so that a side of each the plurality of reflective pieces of sheet metal the dimension of which is substantially equal to the length of the ribs, are arranged orthogonally with respect to the axis of rotation of the parabolic solar concentrator;
    fixing ends of the plurality of reflective pieces of sheet metal to beams with strips;
    fixing the plurality of reflective pieces of sheet metal to the ribs with appropriately shaped removable brackets.

11. The process according to claim 10, further comprising the step of fixing the plurality of reflective pieces of sheet metal to the ribs with the use of glue and/or bi-adhesive elements.

12. The system according to claim 2, wherein each of the plurality of ribs is composed of two arms, each in the form of a semi-parabola, that are joined together at a level of a vertex of the dish.

* * * * *